United States Patent
Foster

(10) Patent No.: US 6,437,449 B1
(45) Date of Patent: Aug. 20, 2002

(54) MAKING SEMICONDUCTOR DEVICES HAVING STACKED DIES WITH BIASED BACK SURFACES

(75) Inventor: Donald C. Foster, Mesa, AZ (US)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 09/828,396

(22) Filed: Apr. 6, 2001

(51) Int. Cl.⁷ .............................................. H01L 21/70
(52) U.S. Cl. ....................... 257/777; 257/676; 438/107
(58) Field of Search .............................. 257/686, 784, 257/723, 777, 676; 438/109; 361/735, 742

(56) References Cited

U.S. PATENT DOCUMENTS

| 4,763,188 A | 8/1988 | Johnson ........................ 357/74 |
| 5,012,323 A | 4/1991 | Farnworth .................... 357/75 |
| 5,291,061 A | 3/1994 | Ball ............................ 257/686 |
| 5,323,060 A | 6/1994 | Fogal et al. ................. 257/777 |
| 5,422,435 A | 6/1995 | Takiar et al. ............... 257/686 |
| 5,502,289 A | 3/1996 | Takiar et al. ............... 174/266 |
| 5,569,625 A | 10/1996 | Yoneda et al. .............. 437/217 |
| 5,715,147 A | 2/1998 | Nagano ...................... 361/813 |
| 5,815,372 A | 9/1998 | Gallas ........................ 361/760 |
| 5,886,412 A | 3/1999 | Fogal et al. ................. 257/777 |
| 5,898,220 A | 4/1999 | Ball ............................ 257/723 |
| 6,005,778 A | 12/1999 | Spielberger et al. ........ 361/770 |
| RE36,613 E | 3/2000 | Ball ............................ 257/777 |
| 6,057,598 A | 3/2000 | Payne et al. ................. 257/723 |
| 6,072,243 A | 6/2000 | Nakanishi ................... 257/783 |
| 6,133,637 A | 10/2000 | Hikita et al. ................ 257/777 |
| 6,225,146 B1 | 5/2001 | Yamaguchi et al. ........ 438/123 |
| 6,313,527 B1 | 11/2001 | Han et al. ................... 257/723 |

FOREIGN PATENT DOCUMENTS

| JP | 62-126661 | 6/1987 | ........... H01L/25/04 |
| JP | 63128736 | 6/1988 | ........... H01L/23/04 |
| JP | 4-56262 | 2/1992 | ......... H01L/25/065 |
| JP | 10-256470 | 9/1998 | ......... H01L/25/065 |

*Primary Examiner*—Steven Loke
*Assistant Examiner*—Patricia M. Costanzo
(74) *Attorney, Agent, or Firm*—Skjerven Morrill LLP

(57) ABSTRACT

A semiconductor device has multiple, stacked dies in which the back surfaces of each die can be biased to the same or a different electrical potential. The device includes a substrate having a plurality of electrically conductive leads arrayed around an electrically conductive die-mounting pad. A first semiconductor die is mounted on and in electrical connection with the pad. A uniformly thin spacer is mounted on the first die inside the inner periphery of the wire bonding pads thereon and such that the spacer is electrically isolated from the first die. A second die is mounted on the spacer with a layer of electrically conductive material. The layer of conductive material and the die pad are electrically connected to the same or different leads of the substrate such that, by connecting the leads to the same or different electrical potentials, the respective back surfaces of the dies are biased to the same or different potentials.

20 Claims, 2 Drawing Sheets

MAKING SEMICONDUCTOR DEVICES HAVING STACKED DIES WITH BIASED BACK SURFACES

BACKGROUND

1. Technical Field

This invention pertains to semiconductor device packaging in general, and in particular, to packaging semiconductor device having stacked dies with electrically biased back surfaces.

2. Related Art

A demand for electronic devices that are smaller, lighter, and yet more functional has resulted in a concomitant demand for semiconductor packages that have smaller outlines and mounting footprints, yet which are capable of increased component packaging densities. One approach to satisfying this demand has been the development of techniques for stacking the semiconductor dies, or "chips," contained in the package on top of one another. Examples of die-stacking techniques may be found in, for example, U.S. Pat. Nos. 5,323,060 and 5,721,452 to R. Fogel, et al.; U.S. Pat. No. 5,815,372 to W. N. Gallas; U.S. Pat. No. 5,898,220 and Re. 36,613 to M. B. Ball; and, Japanese Patent Disclosures 62-126661, 4-56262, 63-128736, and 10-256470.

Another demand has been for devices in which the back surfaces of the respective dies can be biased to an electrical potential, e.g., ground ("$V_{ss}$"). A prior art approach to meeting this demand may be found in, e.g., U.S. Pat. No. 6,005,778 to R. K. Speilberger, et al. In this device, a substrate, e.g., a ceramic laminate, has an electrically conductive die-mounting pad surrounded by a plurality of conductive pads or leads. A first semiconductor die is mounted on the die-mounting pad such that its back surface is in electrical connection with the pad, i.e., with an electrically conductive adhesive.

An electrically conductive spacer is mounted on the front surface of the first die such that it is electrically isolated therefrom. The spacer is sized to fit inside wire bonding pads on the front surface of the first die, and has a plated, peripheral wire bonding "tier," or step, formed therein, so that both the step and the bonding pads are frontally exposed for wire bonding. The die-mounting pad and the peripheral step in the spacer are respectively wire bonded to a specific lead of the substrate.

A second semiconductor die is mounted with its back surface on and in electrical connection with the spacer, i.e., with an electrically conductive adhesive. By connecting the specific lead to an electrical potential, e.g., $V_{ss}$, both the die-mounting pad and the spacer, and hence, the respective back surfaces the two dies are biased to that potential.

While the prior art device provides one approach to the demand for a device having stacked dies with biased back surfaces, the electrically conductive spacer, with its plated, peripheral wire bonding step, increases the complexity and thickness of the device, resulting in a thicker, more costly device. A thinner, less costly solution is therefore desirable.

SUMMARY

This invention provides a semiconductor device having multiple, stacked dies of the same or different sizes in which the back surfaces of each die can be biased to the same or different electrical potentials, in a package that is thinner and simpler to construct than those afforded by the prior art.

In one advantageous embodiment, the novel device includes a substrate, e.g., a lead frame, that includes an electrically conductive die-mounting pad and a plurality of electrically conductive leads arrayed around the pad. A first semiconductor die having a front surface with a plurality of wire bonding pads arrayed around a periphery thereof, and an opposite back surface, is mounted on the die-mounting pad such that the back surface of the die is in electrical connection with the pad.

A spacer of a uniform thickness is provided. The spacer may be of an electrically conductive or a dielectric material, and has a front surface, an opposite back surface, and an outer periphery that is smaller than an inner periphery of the wire bonding pads on the first die. The spacer is mounted on the front surface of the first die such that the spacer is located inside the inner periphery of the wire bonding pads thereon and is electrically isolated therefrom.

In one possible embodiment, at least one electrically conductive wire is bonded at a first end to at least a first lead of the substrate, the die-mounting pad, or a first wire bonding pad on the first die, and at a second end to the front surface of the spacer. In another possible embodiment, the second end of the wire is bonded to a second lead of the substrate, to the die-mounting pad, or to a second wire bonding pad on the first die, such that at least a portion of the wire between the two ends extends across at least a portion of the front surface of the spacer.

A second semiconductor die having opposite front and back surfaces is mounted with its back surface on the front surface of the spacer with layer of an electrically conductive material such that the portion of the conductive wire spanning the spacer is embedded in the conductive layer. This mounting electrically connects the back surface of the second die to the conductive wire, enables the thickness of the conductive adhesive to be reduced to the height of the wire bonds, or to the thickness of the wire itself, and eliminates the need for an electrically conductive spacer having a wire bonding "step" thereon, thereby resulting in a device package that is thinner, simpler, and less expensive to make than prior art packages.

The above and many other features and advantages of this invention will become apparent from a consideration of the following detailed description of the various embodiments thereof, particularly if such consideration is made in conjunction with the appended drawings.

DETAILED DESCRIPTION

Figure 1:
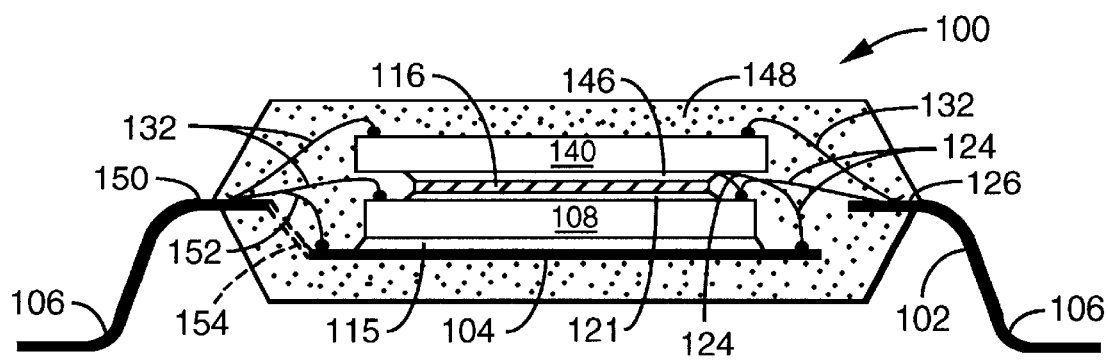
FIG. 1 is a cross-sectional, side elevation view of a semiconductor device in accordance with one embodiment of this invention.
Figure 2:
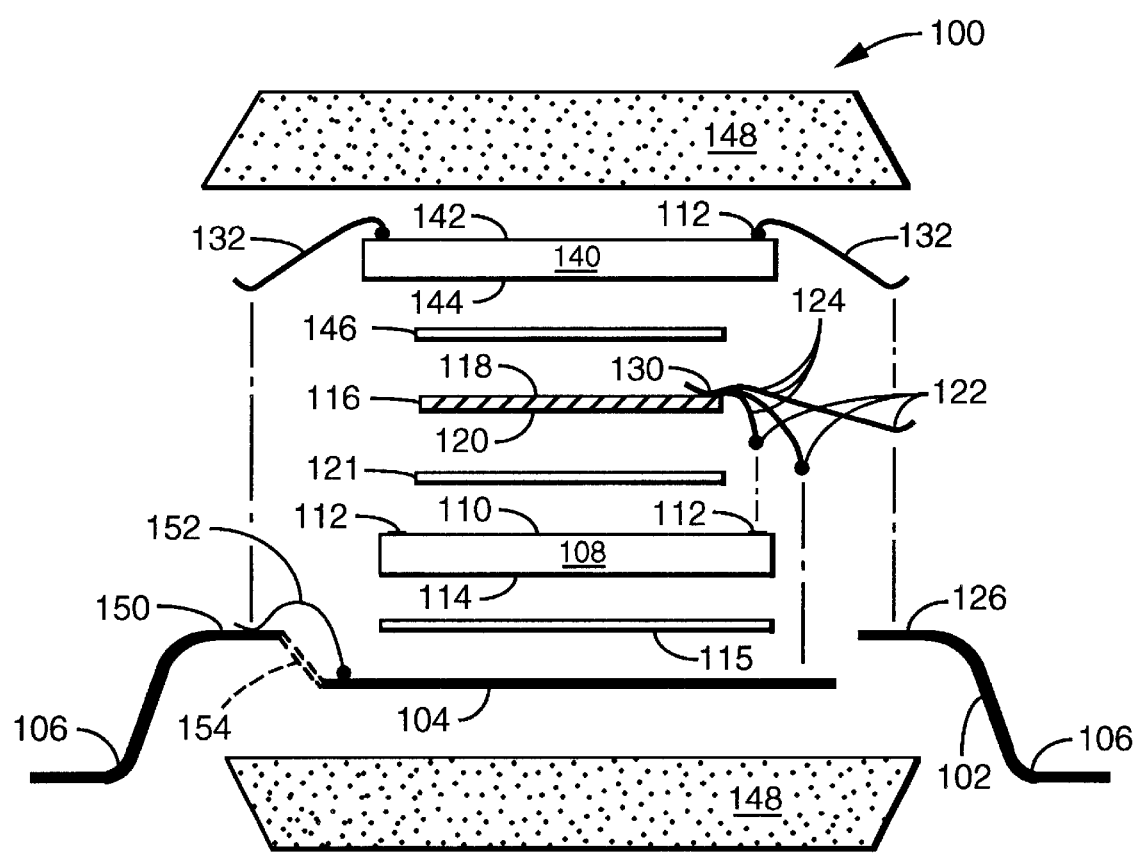
FIG. 2 is an exploded, cross-sectional, side elevation view of the device shown in FIG. 1.

A semiconductor device 100 in accordance with one embodiment of the present invention is illustrated in a cross-sectional, side elevation view in FIG. 1, and in an exploded, cross-sectional, side elevation view in FIG. 2. The device 100 includes a conventional substrate 102 having an electrically conductive die-mounting pad 104 and a plurality of electrically conductive leads 106 arrayed around the pad. The conductive leads 106 are electrically isolated from both the pad 104 and each other.

The substrate 102 may comprise a conventional metal lead frame, or alternatively, a conventional laminate-type of substrate, e.g., a laminate of a patterned metal, e.g., copper foil or tungsten ink, and a dielectric material, e.g., an epoxy-fiberglass composite, a ceramic, or a resin tape, all of which are known substrate types in the art.

A first semiconductor die 108 having a front surface 110, with a plurality of wire bonding pads 112 arrayed around a periphery thereof, and an opposite back surface 114, is mounted on the die-mounting pad 104 such that the back surface 114 of the die is opposed to and in electrical connection with the pad. In this manner, the back surface 114 of the first die 108 is disposed at the same electrical potential as the die-mounting pad 104. In one possible embodiment, the mounting and electrical connection of the first die 108 to the pad 104 can be effected by soldering the back surface of the die to the pad, and in another embodiment, by bonding the die to the pad with a layer 115 of an electrically conductive adhesive, e.g., an epoxy adhesive filled with particles of metal, e.g., silver.

A spacer 116 is mounted on the front surface 110 of the first die 108. In one possible embodiment, the spacer 116 may comprise an electrically conductive material, such as copper, or in an application sensitive to thermally induced stresses, may comprise, e.g., silicon or Alloy 42, to more closely match the thermal coefficient of expansion of the dies. In another embodiment, the spacer 116 may comprise a dielectric, i.e., an electrically insulative material, such as a ceramic, e.g., beryllium oxide or silicon dioxide, or a composite, such as fiberglass impregnated with an epoxy resin. In yet another embodiment, the spacer 116 can comprise a dielectric material having a thin metal cladding on its front surface 118. In any of the foregoing embodiments, it may be desirable to plate the front surface 118 of the spacer 116 locally or globally with a metal that facilitates wire bonding, e.g., a gold-over-nickel or silver plating on copper or Alloy 42, or an aluminum plating on silicon.

The spacer 116 is uniformly thick, has an outer periphery that is smaller than an inner periphery of the wire bonding pads 112 on the first die 108, a front surface 118, and an opposite back surface 120. The spacer 116 is mounted with its back surface 120 in opposition to the front surface 110 of the first die 108 with, e.g., an electrically insulative, double-sided adhesive tape, or a layer 121 of epoxy resin, such that the spacer, whether conductive or not, is electrically isolated from the first die, and such that the spacer is located inside the inner periphery of the wire bonding pads 112 disposed thereon. This facilitates wire bonding to both the front surface 118 of the spacer 116 and to the bonding pads 112 of the first die 108 adjacent thereto after the spacer has been mounted on the first die.

In the embodiment illustrated in FIGS. 1 and 2, a first end 122 of at least one electrically conductive wire 124 is metallurgically bonded to at least one of a first lead 126 of the substrate 102, the die-mounting pad 104, or to a first wire bonding pad 112, e.g., a grounding pad, on the first die 108. A second end 130 of the wire 124 is bonded to the front surface 118 of the spacer 116 in the following manner. If the spacer 116 is of a metal, or a dielectric material with a metal plating or cladding on its front surface 118, such as a copper-clad fiberglass composite, then the second end 130 of the conductive wire 124 is metallurgically bonded to the metal on the front surface of the spacer 116 using conventional ultrasonic or thermal-compression wire bonding techniques and equipment.

If the spacer 116 is of a dielectric material, such as a fiberglass-epoxy composite or a ceramic, for example, then conventional wire bonding techniques and equipment can still be used to bond the second end 130 of the conductive wire 124 to the front surface 118 of the spacer 116, provided the surface is sufficiently rough or porous to permit the wire to mechanically bond with it, and provided further that the material of the spacer is hard and strong enough to prevent the wire from piercing through the spacer during bonding and shorting to the front surface 110 of the first die 108. As discussed below, the purpose of the bond between the second end 130 of the conductive wire 124 and the front surface 118 of the spacer 116 is simply to hold the second end of the wire in place until a second die 140 is mounted on the spacer, not to make an electrical connection with the spacer, and hence, either a metallurgical or a mechanical bond between the two is sufficient.

Other conductive wires 132 (omitted from the first die 108 in FIG. 2 for clarity) are also conventionally bonded between other ones of the wire bonding pads 112 on the first die 108 and selected other ones of the signal and power leads 106 of the substrate 102. The wire bonds to the die-mounting pad 104, substrate leads 106, wire bonding pads 112, and the first surface 118 of the spacer 116 can be either conventional "ball," or "first," bonds, or alternatively, "stitch," "crescent," "wedge," or "second" bonds. However, the latter type have a relatively lower height above the bonding surface than do the former, and when used on the first die 108 and spacer 116, enable an appreciable reduction in the overall thickness of the device 100 to be achieved. The conductive wires 124 and 132 themselves can include conventional 1 mil (0.001 in., 0.025 mm) diameter gold or aluminum bonding wire, or optionally, a flat "ribbon" bonding wire.

After the first die 108 and spacer 116 are mounted and wire bonded as described above, a second semiconductor die 140 having front surface 142 with a plurality of wire bonding pads 112 around a periphery thereof, and an opposite back surface 144 is mounted with its back surface 144 in opposition to the front surface 118 of the spacer with a layer 146 of an electrically conductive material that substantially fills the space between the spacer and the second die and such that the second end 130 of the conductive wire 124 is embedded in the conductive layer. The conductive layer 146 may comprise, e.g., a filled epoxy adhesive, as above.

By embedding the second end 130 of the conductive wire 124 in the layer 146 of conductive material, the entire back surface 144 of the second die 140 is thereby biased to the same electrical potential as that on the conductive wire 124, and the thickness of the conductive layer 146 may be reduced to the height of the bond of the second end of conductive wire above the spacer. Also, embedding the second end 130 of the conductive wire 124 in the conductive layer 146 eliminates the need for an electrically conductive spacer 116 and a wire bonding "step" thereon, and reinforces the wires and their bonds to the spacer against breakage during subsequent manufacturing processes, e.g., encapsulation of the package.

After the second die 140 is mounted and wire bonded to, e.g., power and signal leads 106 of the substrate 102 with conventional wire bonds 132, the package can be conventionally encapsulated in an envelope 148 of protective plastic.

As those of skill in the art will appreciate, the above method makes possible many different ways of connecting, or biasing, the respective back surfaces 114 and 144 of the first and second dies 108 and 140 to the same or different electrical potentials. Thus, in some applications, it may be desirable to bias the back surfaces of both dies to the same, e.g., ground reference potential, "$V_{ss}$." For example, in only one of the several ways possible of connecting the device 100 illustrated to achieve this, a first one of the conductive wires 124 can be bonded between the spacer 116 and a first lead 126, which is maintained at $V_{ss}$, and a second one of the conductive wires 124 can be bonded between the spacer and the die mounting pad 104 to complete the circuit and bias the back sides of both dies 108 and 140 to $V_{ss}$. Other possible connections to achieve this same result will be apparent to those of skill in the art.

In other applications, it may be desirable to bias the respective back surfaces 114, 144 of the two dies 108 and 140 to two different ground reference potentials, e.g., a "power" ground reference "$V_{ss1}$" and a "signal" ground reference "$V_{ss2}$". In such an application, a first one of the conductive wires 124 can be bonded between the spacer 116 and a first lead 126 maintained at $V_{ss1}$ to bias the back surface 144 of the second die 140 to that potential, and the die-mounting pad 104 can be independently connected to a second lead 150 of the substrate 102, which is maintained at $V_{ss2}$, such that the back surface 114 of the first die 108 is biased to $V_{ss2}$ independently of the electrical bias on the back surface of the second die. As above, there are many other possible ways of connecting the device 100 to achieve this same result that will be apparent to those of skill in the art.

The means for electrically connecting the die-mounting pad 104 to the second lead 150 of the substrate 102 can include, in a lead frame type of substrate 102, a conventional wire bond 152, as shown in FIGS. 1 and 2, or a conventional "fused lead" 154 (shown by dashed lines in FIGS. 2 and 3), and in a laminate type of substrate, by a simple circuit pattern, or etched "trace," which is functionally equivalent thereto.

Figure 3:
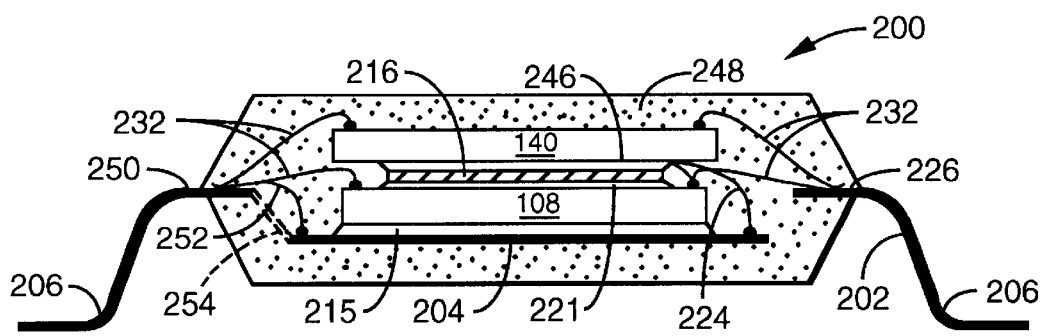
FIG. 3 is a cross-sectional, side elevation view of a semiconductor device in accordance with another embodiment of this invention; and, FIG. 4 is an exploded, cross-sectional, side elevation view of the device shown in FIG. 3.
Figure 4:
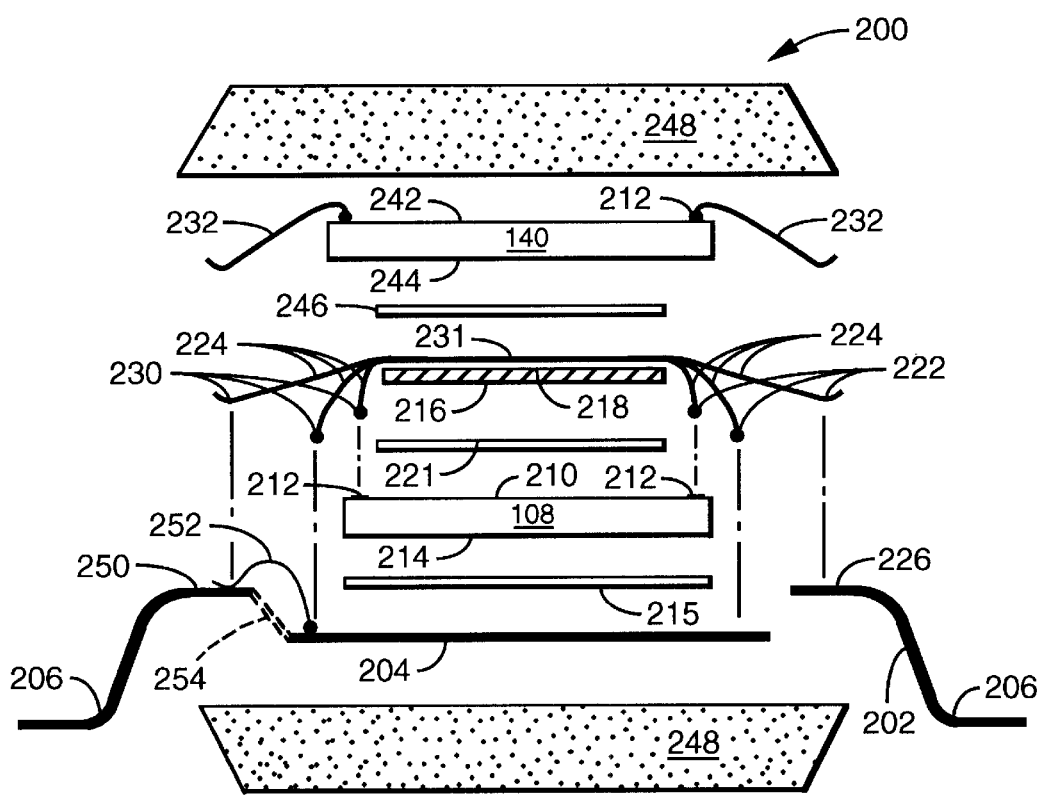

A second embodiment of a semiconductor device 200 in accordance with the present invention is illustrated in FIGS. 3 and 4. The second embodiment of the device 200 is substantially similar to the first embodiment of the device 100 illustrated in FIGS. 1 and 2. The reference numbers of the elements of the device 200 that are the same or similar to those in the first device 100 are obtained by adding 100 to the reference numbers of the corresponding elements of the first device.

The second embodiment of the device 200 includes a conventional substrate 202 having an electrically conductive die-mounting pad 204 and a plurality of electrically conductive leads 206 arrayed around the pad. As in the first embodiment, a first semiconductor die 208 having a front surface 210, with a plurality of wire bonding pads 212 arrayed around a periphery thereof, and an opposite back surface 214, is mounted on the die-mounting pad 204 such that the back surface 214 of the die is opposed to and in electrical connection with the pad.

A spacer 216 is mounted on the front surface 210 of the first die 208. As in the first embodiment, the spacer 216 is uniformly thick, has an outer periphery that is smaller than an inner periphery of the wire bonding pads 212 on the first die 108, a front surface 218, and an opposite back surface 220. The spacer 216 is mounted with its back surface 220 in opposition to the front surface 210 of the first die 208 such that the spacer is electrically isolated from the first die, and is located inside the inner periphery of the wire bonding pads 212 disposed thereon. As above, the spacer 216 may comprise an electrically conductive material, a dielectric material, or a dielectric material having a thin metal cladding or plating on its front surface 218.

As in the first embodiment above, after the spacer 216 has been mounted to the first die 208 in the second device 200, a first end 222 of at least one electrically conductive wire 224 is metallurgically bonded to a first lead 226 of the substrate 202, the die-mounting pad 204, or to a first wire bonding pad 212, e.g., a ground pad, on the first die 208. However, in contrast to the first embodiment, a second end 230 of the wire 224 is then metallurgically bonded to a second lead 250 of the substrate 202, to the die-mounting pad 204, or to a second wire bonding pad 212 on the first die 208, in such a way that at least a portion 231 of the wire 224 spans, i.e., extends across, at least a portion of the front surface 218 of the spacer 216 (see FIG. 4). In this regard, it may be seen that it is desirable to bond the two ends 222 and 230 of the conductive wire 224 to features that are respectively located on two different sides of the spacer 216, e.g., on opposite sides thereof, as shown in FIG. 4.

As in the first embodiment, after the first die 208 and spacer 216 are mounted and wire bonded as described above, a second semiconductor die 240 is mounted with its back surface 244 in opposition to the front surface 218 of the spacer with a layer 246 of an electrically conductive material that substantially fills the space between the spacer and the second die and such that the portion 231 of the conductive wire 224 that extends across the front surface 218 of the spacer 216 is embedded in the conductive layer. As above, embedding the portion 231 of the conductive wire 224 in the conductive layer 246 electrically connects the entire back surface 244 of the second die 240 to the same electrical potential as that on the conductive wire 224, without the need to bond the second end 230 of the conductive wire 224 to the front surface 218 of the spacer 216.

It should be noted that the two ends 222 and 230 of the wire 224 need not be bonded to identical features on the two sides of the spacer 216. Thus, as only one example of the many possible ways that the conductive wire 224 can be connected, it is possible to form a series of "stitches" with the same wire, by sequentially bonding the first end 222 to, e.g., a first lead 226 of the substrate 202 (maintained at, e.g., $V_{ss}$), then to, e.g., a ground pad 212 on the first die 208, then across the front surface 218 of the spacer 216 as above, and then to the die-bonding pad 204 on the other side of the spacer. This particular sequential-stitch connection effectively biases the ground pad 212 on the first die 108, as well as the back surfaces 214 and 244 of both dies 208 and 240 to $V_{ss}$.

Thus, it may be seen that both embodiments of semiconductor device 100 and 200 described herein enable the respective back surfaces of the dies stacked therein to be easily biased to the same or to different electrical potentials, in a package that is thinner, simpler to construct, and hence, less expensive, than those afforded by the prior art.

Those of skill in the art will appreciate that many modifications, variations, and substitutions can be made in terms of the materials and methods of the present invention without departing from its scope and spirit. For example, the respective methods for biasing the back side of the dies in the two devices are not exclusive of each other, but can be combined. Moreover, the devices are not limited to the number of dies and spacers shown and described herein, but can be expanded to incorporate additional dies and spacers, depending on the particular application at hand. Similarly, the devices are not limited to dies of the same size, as illustrated herein, but rather, can accommodate dies of different sizes, and which can be stacked in any order desired.

In light of the foregoing, the scope of the present invention should not be measured by that of the particular embodiments described and illustrated herein, as these are merely exemplary in nature, but rather, by that of the claims appended below and their functional equivalents.

What is claimed is:

1. A semiconductor device, comprising:
   a substrate having a plurality of electrically conductive leads arrayed around an electrically conductive die-mounting pad;
   a first semiconductor die mounted on the substrate, the first die having a front surface with a plurality of wire bonding pads arrayed around a periphery thereof, and an opposite back surface mounted opposed to and in electrical connection with the die-mounting pad of the substrate;
   a uniformly thick spacer mounted on the first die, the spacer having an outer periphery smaller than an inner periphery of the wire bonding pads on the first die, a front surface, and an opposite back surface mounted opposed to and electrically isolated from the front surface of the first die, and such that the spacer is located inside the inner periphery of the wire bonding pads thereon;
   at least one electrically conductive wire having opposite first and second ends, the first end being bonded to a first lead of the substrate, the die-mounting pad, or a first wire bonding pad on the first die, and the second end being bonded to the front surface of the spacer; and,
   a second semiconductor die mounted on the spacer with a layer of an electrically conductive material, the second die having a front surface with a plurality of wire bonding pads arrayed around a periphery thereof, and an opposite back surface being mounted opposed to and in electrical connection with the front surface of the spacer, and such that the second end of the at least one first conductive wire is embedded in the conductive layer.

2. The semiconductor device of claim 1, further comprising means for electrically connecting the die-mounting pad to a second lead of the substrate.

3. The semiconductor device of claim 1, further comprising a fused lead, a second conductive wire, or a circuit trace electrically connecting the die-mounting pad to a second lead of the substrate.

4. The semiconductor device of claim 1, wherein the spacer comprises a dielectric material.

5. The semiconductor device of claim 1, wherein the second end of the at least one conductive wire is bonded to the front surface of the spacer with a metallurgical bond.

6. The semiconductor device of claim 1, wherein the second end of the at least one conductive wire is bonded to the front surface of the spacer with a non-metallurgical bond.

7. The semiconductor device of claim 1, wherein the substrate comprises a metal lead frame, or a patterned metal laminated with an epoxy-fiberglass composite, a ceramic, or a resin tape.

8. A semiconductor device, comprising:
   a substrate having a plurality of electrically conductive leads arrayed around an electrically conductive die-mounting pad;
   a first semiconductor die mounted on the substrate, the first die having a front surface with a plurality of wire bonding pads arrayed around a periphery thereof, and an opposite back surface being mounted opposed to and in electrical connection with the die-mounting pad of the substrate;
   a uniformly thick spacer mounted on the first die, the spacer having an outer periphery smaller than an inner periphery of the wire bonding pads on the first die, a front surface, and an opposite back surface being mounted opposed to and electrically isolated from the front surface of the first die, and such that the spacer is located inside the inner periphery of the wire bonding pads thereon;
   at least one electrically conductive wire having opposite first and second ends, the first end being bonded at one side of the spacer to a first lead of the substrate, the die-mounting pad, or a first wire bonding pad on the first die, and the second end being bonded at another side of the spacer to a second lead of the substrate, the die-mounting pad, or a second wire bonding pad on the first die, at least a portion of the at least one conductive wire extending across the front surface of the spacer; and,
   a second semiconductor die mounted on the spacer with a layer of an electrically conductive material, the second die having a front surface with a plurality of wire bonding pads arrayed around a periphery thereof, and an opposite back surface being mounted opposed to and in electrical connection with the front surface of the spacer, and such that the portion of the at least one conductive wire extending across the front surface of the spacer is embedded in the conductive layer.

9. The semiconductor device of claim 8, further comprising means for electrically connecting the die-mounting pad to a second lead of the substrate.

10. The semiconductor device of claim 8, further comprising a fused lead, a second conductive wire, or a circuit trace electrically connecting the die-mounting pad to a second lead of the substrate.

11. The semiconductor device of claim 8, wherein the spacer comprises of a dielectric material.

12. A semiconductor device, comprising:
   a substrate having a plurality of electrically conductive portions;
   a first semiconductor die having a first surface mounted on and electrically coupled to one of the electrically conductive portions of the substrate and an opposite second surface including a plurality of bond pads;
   a spacer having a first surface and an opposite second surface, wherein the first surface is on and in a non-electrically conductive connection with the second surface of the first semiconductor die, and said spacer is disposed entirely within a perimeter of the second surface and within the bond pads thereof,
   a second semiconductor die having a first surface juxtaposed with and attached to the second surface of the spacer with an electrically conductive adhesive layer;
   a first metal wire having a first portion on the second surface of the spacer under the juxtaposed first surface of the second semiconductor die, and a first end electrically coupled to one of the electrically conductive portions of the substrate, wherein said first portion is embedded in the electrically conductive adhesive layer and is electrically coupled to the first surface of the second semiconductor die by the electrically conductive adhesive layer.

13. The semiconductor device of claim 12, wherein the first portion of the first metal wire includes a second end of the metal wire, and said second end is connected to the second surface of the spacer with a non-metallurgical bond.

14. The semiconductor device of claim 12, wherein the first metal wire has a second end opposite the first end, the first portion is between the first end and the second end, and the second end is electrically coupled to another one of the electrically conductive portions of the substrate.

15. The semiconductor device of claim 12, wherein the first portion of the first metal wire includes a second end of the metal wire, and said second end is connected to the second surface of the spacer.

16. A semiconductor device, comprising:
- a substrate having a plurality of electrically conductive portions;
- a first semiconductor die and a second semiconductor die, said semiconductor dies being coupled to the substrate and vertically stacked with a spacer between them;
- a metal wire having opposed first and second ends and a central portion therebetween, wherein the first and second ends are electrically coupled to separate ones of the electrically conductive portions of the substrate, and the central portion overlies the spacer between juxtaposed surfaces of the spacer and the second semiconductor die; and
- an adhesive material coupling the spacer to the second semiconductor die, wherein the central portion of the metal wire contacts the adhesive material.

17. The semiconductor device of claim 16, wherein the adhesive material is electrically conductive, and the adhesive material electrically couples the central portion to the second semiconductor die.

18. The semiconductor device of claim 17, wherein the first semiconductor die is on and electrically coupled to a second one of the electrically conductive portions of the substrate.

19. The semiconductor device of claim 17, wherein the spacer is in a nonelectrically conductive connection with a juxtaposed surface of the first semiconductor die, and an opposite surface of the first semiconductor die is on and electrically coupled to a second one of the electrically conductive portions of the substrate.

20. The semiconductor device of claim 16, wherein the spacer is in a nonelectrically conductive connection with a juxtaposed surface of the first semiconductor die, and an opposite surface of the first semiconductor die is electrically coupled to a second one of the electrically conductive portions of the substrate.

* * * * *